(12) United States Patent
Choi

(10) Patent No.: US 6,483,144 B2
(45) Date of Patent: *Nov. 19, 2002

(54) SEMICONDUCTOR DEVICE HAVING SELF-ALIGNED CONTACT AND LANDING PAD STRUCTURE AND METHOD OF FORMING SAME

(75) Inventor: Seungmoo Choi, Orlando, FL (US)

(73) Assignee: Agere Systems Guardian Corp., Orlando, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 34 days.

(21) Appl. No.: 09/451,054

(22) Filed: Nov. 30, 1999

(65) Prior Publication Data

US 2002/0000601 A1 Jan. 3, 2002

(51) Int. Cl.$^7$ .............................................. H01L 29/788
(52) U.S. Cl. ...................... 257/315; 257/314; 257/754; 257/756
(58) Field of Search ................................. 257/754, 756, 257/316, 315, 314

(56) References Cited

U.S. PATENT DOCUMENTS

| | | | |
|---|---|---|---|
| 5,036,378 A | 7/1991 | Lu et al. ...................... 357/23.5 |
| 5,166,771 A | 11/1992 | Godinho et al. ............ 257/368 |
| 5,281,555 A | * 1/1994 | Cho ............................ 437/195 |
| 5,298,792 A | * 3/1994 | Manning ..................... 257/758 |
| 5,327,224 A | * 7/1994 | Ikegami et al. ............... 257/380 |
| 5,744,853 A | * 4/1998 | Quek et al. ................... 257/532 |
| 5,760,458 A | * 6/1998 | Bergemont et al. ......... 257/588 |
| 5,780,339 A | 7/1998 | Liu et al. ..................... 438/253 |
| 5,828,130 A | 10/1998 | Miller et al. ................. 257/754 |
| 5,866,449 A | 2/1999 | Liaw et al. .................. 438/238 |
| 5,895,961 A | 4/1999 | Chen .......................... 257/382 |
| 5,907,779 A | 5/1999 | Choi .......................... 438/279 |
| 5,923,988 A | 7/1999 | Cheng et al. ............... 438/305 |
| 5,945,738 A | 8/1999 | Nguyen et al. ............. 257/756 |
| 6,023,099 A | * 2/2000 | Komuro ..................... 257/758 |

FOREIGN PATENT DOCUMENTS

JP 404218918 A * 8/1992

* cited by examiner

*Primary Examiner*—Steven Loke
*Assistant Examiner*—Douglas W. Owens
(74) *Attorney, Agent, or Firm*—Allen, Dyer, Doppelt, Mibrath & Gilchrist P.A.

(57) ABSTRACT

A semiconductor integrated circuit device and method of forming same is disclosed and includes a silicon substrate having a field oxide region and spaced active region. First and second self-aligned contact window openings are associated with a respective field oxide region and active region. A dummy polysilicon landing pad is formed over the field oxide region and formed below the first self-aligned contact window opening. An operative polysilicon landing pad is formed above the dummy landing pad. A silicon nitride barrier layer is also formed during the process.

8 Claims, 8 Drawing Sheets

SEMICONDUCTOR DEVICE HAVING SELF-ALIGNED CONTACT AND LANDING PAD STRUCTURE AND METHOD OF FORMING SAME

FIELD OF THE INVENTION

This invention relates to the field of semiconductor devices, and more particularly, this invention relates to a semiconductor device and process for manufacturing self-aligned contacts and landing pad structures of integrated circuits having broad applicability in memory and logic devices.

BACKGROUND OF THE INVENTION

Self-aligned contact and gate formation techniques are used in integrated circuit fabrication, and are commonly used in dynamic random access memory (DRAM) and static random access memory (SRAM) processes, such as those devices used as flash memory devices. These semiconductor memory devices typically include various contact windows that often receive polysilicon or other plugs and connect cell transistor source regions to a respective storage electrode of a cell capacitor. Contact windows also connect cell transistor drain regions to respective bit lines. Often, these types of semiconductor devices include floating gate structures where data can be stored in the form of a charge on a floating gate.

The contact windows should be small dimension, and preferably smaller than the resolution limits of the exposure tools used to form the respective semiconductor devices. One common prior art contact window manufacturing technique is referred to as self-aligned contact, which often uses a window opening to a source/drain region located between word lines or gate structures. The self-aligned contact opening typically is larger in width than the space existing between word line structures. This self-aligned contact window opening, therefore, could include not only the entire width of the source/drain region, but also include some exposure of a portion of the top surface of an insulator capped, polycide gate structure, or other gate structure formed by techniques known to those skilled in the art.

Additionally, it is well known by those skilled in the art that various feature sizes and minimum space or design tolerances are maintained between semiconductor devices to maintain the electrical integrity of the semiconductor device. Any misalignment in the formation of metal contacts, for example, into a diffused region of the semiconductor device, could cause other problems in the required spacing that should exist between a contact and the surrounding device, such as a polysilicon gate. To avoid these problems created when a metal contact is misaligned, for example, between a metal contact and the gate, a landing pad is often formed between the metal contact and an underlying diffused region. The landing pad is usually formed from a doped polysilicon layer over which a silicide layer can be formed to decrease sheet resistance to tolerable levels. The landing pad usually allows for reduction in the size of the cell and tolerates greater misalignment problems.

Examples of various semiconductor devices and method of manufacturing the devices with appropriate self-aligned contacts and/or landing pads are disclosed in U.S. Pat. Nos. 5,166,771; 5,828,130; 5,866,449; 5,895,961; 5,907,779; and 5,923,988, the disclosures which are hereby incorporated by reference in their entirety.

As noted before, the self-aligned contact manufacturing process is commonly used in most common SRAM and DRAM manufacturing technologies. However, the process usually requires an additional mask and etch process to be comparable to a logic process. Two etch steps are used. A first etch step is used that has little etch selectivity of nitride over an oxide, and a second etch step is used where spacer needs must be anticipated. Thus, it was difficult to define contact window openings on top of both the polysilicon and silicon, and a self-aligned contact window opening at the same time.

SUMMARY OF THE INVENTION

It is therefore an object of the present invention to define a regular window opening and a self-aligned contact window openings at the same time, such as in a floating gate manufacturing process of a memory device.

In accordance with the present invention, a dummy landing pad can be defined and formed during a floating gate process in a polysilicon process to raise an actual polysilicon landing pad such that only one etch and resist process can be used.

In accordance with the present invention, a semiconductor integrated circuit device includes a silicon substrate having a field oxide region and spaced active region formed therein. First and second self-aligned contacts are formed in first and second self-aligned contact window openings are associated with the respective field oxide region and active region. A dummy polysilicon landing pad is formed over the field oxide region and formed below the first self-aligned contact window opening. An operative polysilicon landing pad is formed above the dummy landing pad.

In still another aspect of the present invention, the second self-aligned contact window opening comprises a first, upper portion that is formed during a first self-aligned contact etch step and a second, lower portion is formed during a second self-aligned contact etch step. The first self-aligned contact window opening is formed during the first self-aligned contact etch step. The dummy landing pad is formed during a floating gate fabrication process. A thin oxide layer is positioned below the second self-aligned contact window opening. A polysilicon landing pad overlies a portion of the active region. Sidewall spacers can be formed on the ends of the operative polysilicon landing pad.

In a method aspect of the present invention, the semiconductor integrated circuit device can be formed and comprises the step of forming a field oxide region and spaced active region within a semiconductor substrate. First and second self-aligned contact window openings are formed and associated with the respective field oxide region and active region. The method also comprises the step of forming a dummy polysilicon landing pad over the field oxide region and below the first self-aligned contact window opening. The method comprises the step of forming an operative polysilicon landing pad above the dummy landing pad.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because it now provides a polysilicon process when manufacturing a floating gate that can be used for the definition of a dummy landing pad for an actual poly-landing pad and self-aligned contact window opening in order to raise an actual polysilicon pad. Thus, it is possible to define two contact window openings at the same time if the actual polysilicon is raised by a dummy polysilicon pad. Thus, a self-aligned contact window opening can be defined in the top of a poly-landing pad and will be defined during a self-aligned contact first etch step. It is well known by those skilled in the art that self-aligned contact (SAC) manufacturing has been commonly used with most SRAM and DRAM technologies. However, the self-aligned contact process had required additional mask and etch processes to be comparable to logic processes. In the advantages of the present invention, the self-aligned contact can be made without an additional mask and etch process in a chip used for SRAM (and/or DRAM) memory blocks and Flash FFLA and similar memory blocks.

In accordance with the present invention, dummy poly-landing pad features are added into a floating gate mask. The dummy poly-landing pad overlaps with the actual poly-landing pad for a self-aligned contact window opening. The dummy poly-landing pad is intended to raise the actual poly-landing pad and once the actual landing pad is raised with the dummy landing pad, the window opening can be defined on top of the actual landing pad, while the self-aligned contact window opening is defined on top of a thin oxide layer. A silicon nitride layer has been formed as is known to those skilled in the art. In one aspect of the present invention, the dummy landing pad is defined during the floating gate manufacturing process where it is isolated where the dummy is the floating gate.

Figure 1:
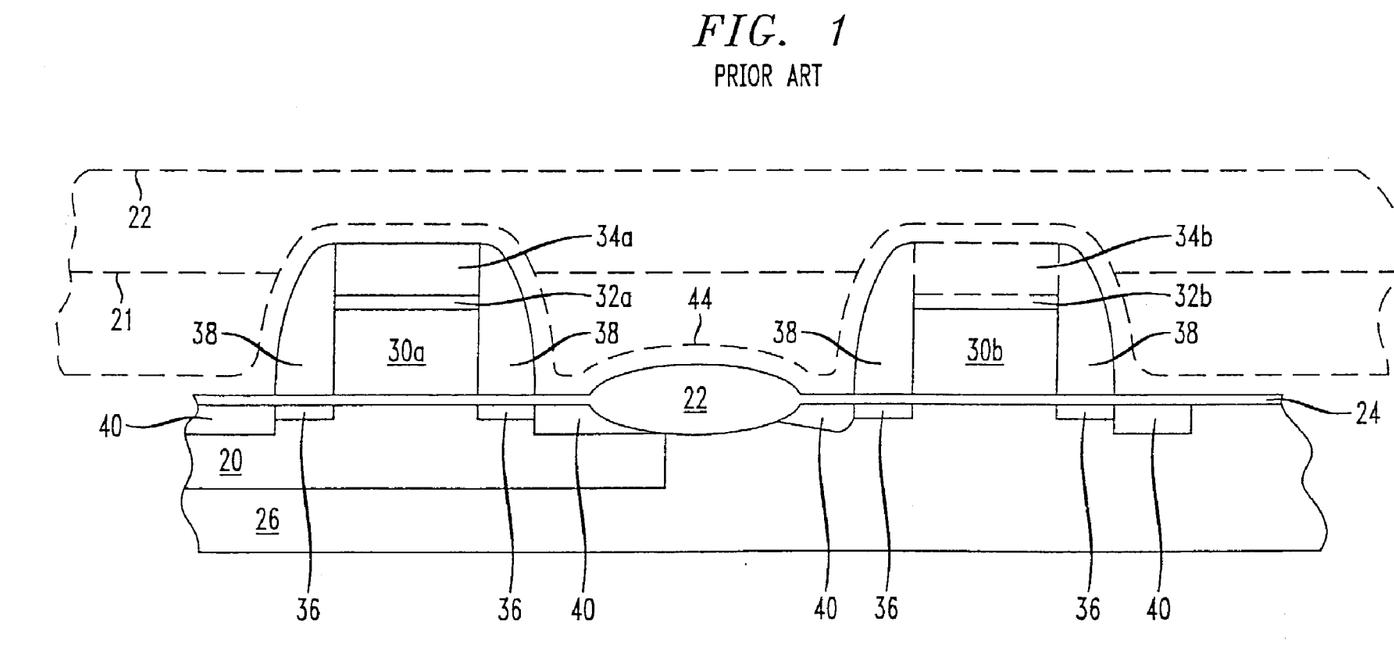
FIG. 1 is a simplified cross-sectional view of a prior art fabrication step of forming a self-aligned contact in a memory device.

FIG. 1 illustrates the basic background and initial stages of forming self-aligned contacts of the prior art where, as an illustration only, a method of forming a MOS field effect transistor of an integrated circuit is used to form N and P wells 20 and field and gate oxidation areas 22, 24 respectively, on a doped silicon substrate 26, in accordance with semiconductor manufacturing techniques known to those skilled in the art. The gate oxide layer 24 can vary in thickness, but can typically be about 50 angstroms thick or other thickness chosen by one skilled in the art.

A layer of polysilicon is first formed by low pressure chemical vapor deposition (LPCVD) and diffusion doped with impurities such as N-type impurities to achieve a desired sheet resistance. The polysilicon layer will later function as gates 30a, 30b in a completed semiconductor device. Usually first level interconnects (not shown) can be located in the periphery of the memory array and formed from this layer of polysilicon. A layer of oxide 32a, 32b then is grown on the polysilicon and followed by a silicon nitride layer 34a, 34b formed on the oxide layer by LPCVD.

The polysilicon gates 30a, 30b are then formed by well known photo-masking and sandwich etching techniques, which can include a plasma etch of the silicon nitride layer and silicon oxide layer and subsequent plasma etching of polysilicon to form polysilicon gates covered by these layers.

Ion implementation forms N- and P-type lightly doped drain (LDD) implants 36 so that the LDD implants have a conductivity type opposite to that of the well or the substrate if no well is present. Chemical vapor deposition of a silicon oxide layer, such as by using TEOS, could be followed by reactive ion etching to form gate sidewall spacers 38 of silicon dioxide. A layer of oxide can be thermally grown to cap the source and drain regions and densify the spacer oxider. N+ and P+ type source and drain regions 40 can be formed by well known mask ion implementation and the dopant concentration is typically a defined amount of dopant atoms per cubic centimeter within these regions. A silicon nitride layer, shown by dotted lines at 44, can be deposited such as by chemical vapor deposition.

During subsequent processing steps not shown, but known to those skilled in the art, gate contact regions can be defined and first and second resist layers (shown as dotted lines 21, 22) can be applied by techniques known to those skilled in the art. Contact window openings are formed through the oxide, nitride and oxide layers to allow electrical contact to be made to a respective gate 30a, 30b. A polysilicon isolation mask can be used to expose a gate by forming a window opening to allow contact to gate 30b, as indicated by dotted lines. The exposed gate 30b can have a contact size extending beyond the gate, thus permitting a looser alignment tolerance. A first photoresist layer 21 that would be applied prevents exposure of the source and drain regions during etching of oxide layers and silicon nitride layer to expose the gate even in the event of a worse case alignment of the mask. Thus, electrical contact to the gate can be made over the active channel region of the transistor under the gate without causing a short circuit between the source or drain and the gate.

As is well known, a multi-step etch can be conducted to expose the gate contact where an oxide is removed in the area exposed by a window opening in the resist layer with a plasma etch. Removal of the first and second photoresist layers can be followed by a standard wet phosphoric acid etch. Removal of the thick oxide layer will decrease the height of the oxide step on the sides of the gate to produce a polysilicon gate contact (not shown) and located above gate 30b. Contacts to the source and drain regions can be defined using a buried contact mask as known to those skilled in the art, where a silicon nitride layer would protect the gate after some portion of the oxide covering the gate has been removed. With a spacer oxide and protective silicon nitride layer intact on the gate 30a, any source and drain contact metallization can be deposited later and will overlap the gate without causing a short circuit between the source and drain in the gate.

As is known to those skilled in the art, any silicon exposed by the source, drain and polysilicon gate contacts and interconnects can be silicided by depositing layers of sputter titanium and then using a rapid thermal annealing, which can protect the underlying source, drain and gate regions and the interconnects during later processing steps. Other layers can be added as known to those skilled in the art, including a layer of sputter titanium, a thick layer of oxide and other layers of polysilicon. Although FIG. 1 and the accompanying description is an example of a semiconductor manufacturing process for self-aligned contact windows, the description shows a typical prior art technique to form self-aligned contacts that the present invention improves upon as will be described below.

It is known to those skilled in the art that certain feature sizes and minimum space or design tolerances must be maintained between semiconductor devices to maintain the electrical integrity of the semiconductor devices. Any misalignment in the formation of metal contacts to various diffused regions could create problems when misalignment or other spacing problems occurs with the metal that contacts the gate area. Thus, landing pads are formed between metal contacts and underlying diffused regions. The landing pads are typically formed from the doped polysilicon layer over which a silicide layer can be formed to decrease sheet resistance to tolerable levels. The landing pad allows a reduction in the size of the cell and tolerates greater misalignment problems. Typically, the landing pad is a good etch stop when etching the contact opening to the landing pad.

In addition, the use of self-aligned contacts have also contributed to smaller and higher performing semiconductor chips in addition to advances in semiconductor fabrication such as photolithography and dry etching. The self-aligned contact concept uses the opening to the source/drain region located between a word line or gate structure, as described above, with the self-aligned contact opening that is larger in width than the space between word line structures. As noted before, metal structures to the source/drain regions exposed in a self-aligned contact opening typically are formed using polysilicon or metal silicide-polysilicon (polycide) layers.

Figure 2:
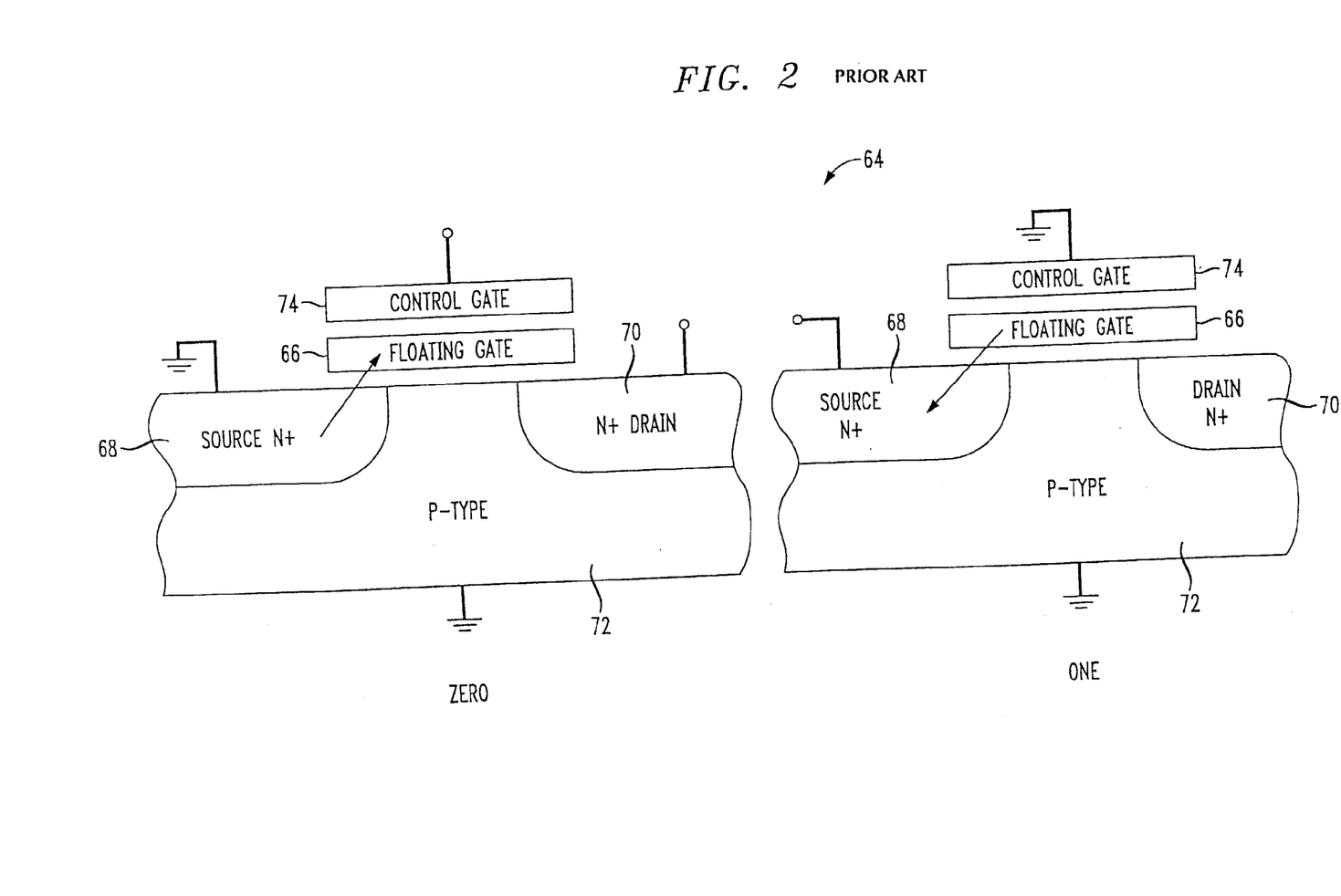
FIG. 2 is a schematic cross-sectional view of a floating gate transistor device.
Figure 3A:
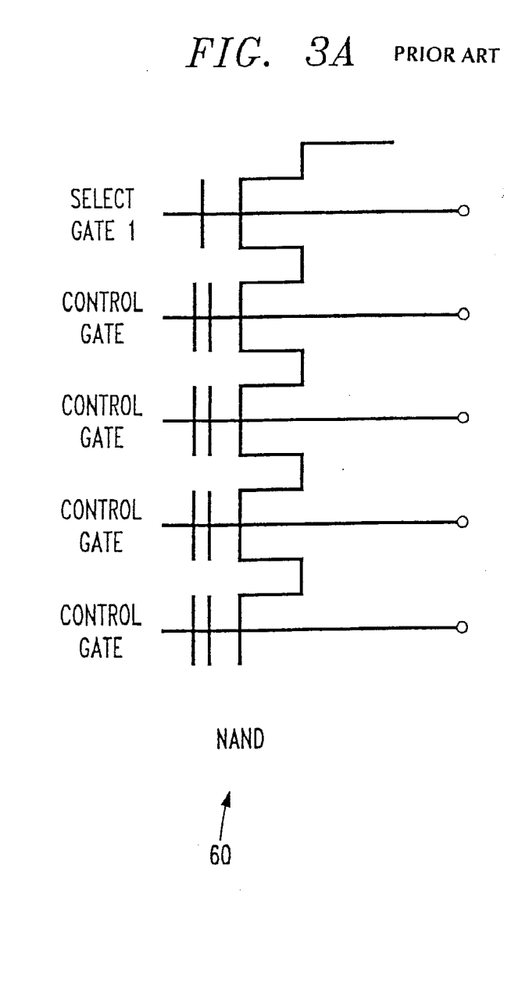
FIGS. 3A and 3B are respective schematic drawings of basic components in a NAND and NOR flash memory circuit.
Figure 3B:
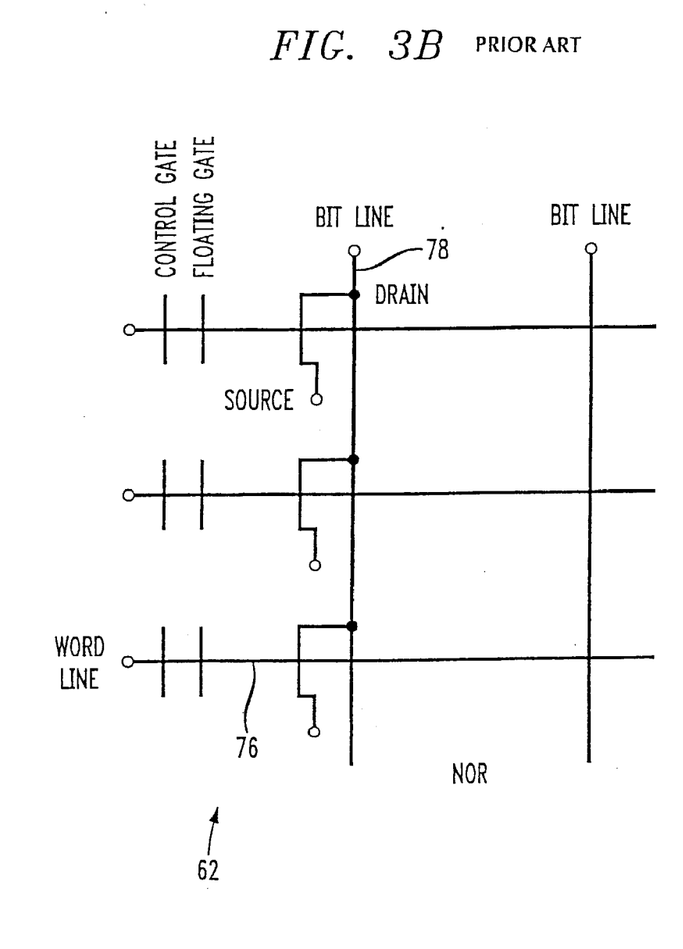

FIGS. 3A and 3B illustrate respective NAND 60 (FIG. 3A) and NOR 62 flash memory cells that use a floating gate transistor 64 as shown in FIG. 2. As known to those skilled in the art, a floating gate transistor 64 has data stored in the form of a charge on a floating gate 66 and is effective in binary information storage because of ease in programming and long-term charge retention. The floating gate is typically surrounded by an insulating layer of $SiO_2$. In most binary applications, information storage is achieved by depositing large amounts of charge on the floating gate 66 or removing the charge from the floating gate. As shown in FIG. 2, the floating gate for a zero value shows electron transfer from the source 68 to the floating gate 66 and for a one value, electron transfer occurs from the floating gate 66 to the source 68. The floating gate transistor 64 includes the respective drain 70, P-type substrate in this example 72, and a control gate 74.

In FIG. 3A, a NAND memory 60 connects cells serially for higher densities, while a NOR cell 62 is connected in parallel for faster access. FIG. 3B shows the respective word lines 76 of the control gate and floating gate, the drain, source and bit lines 78.

Figure 4A:
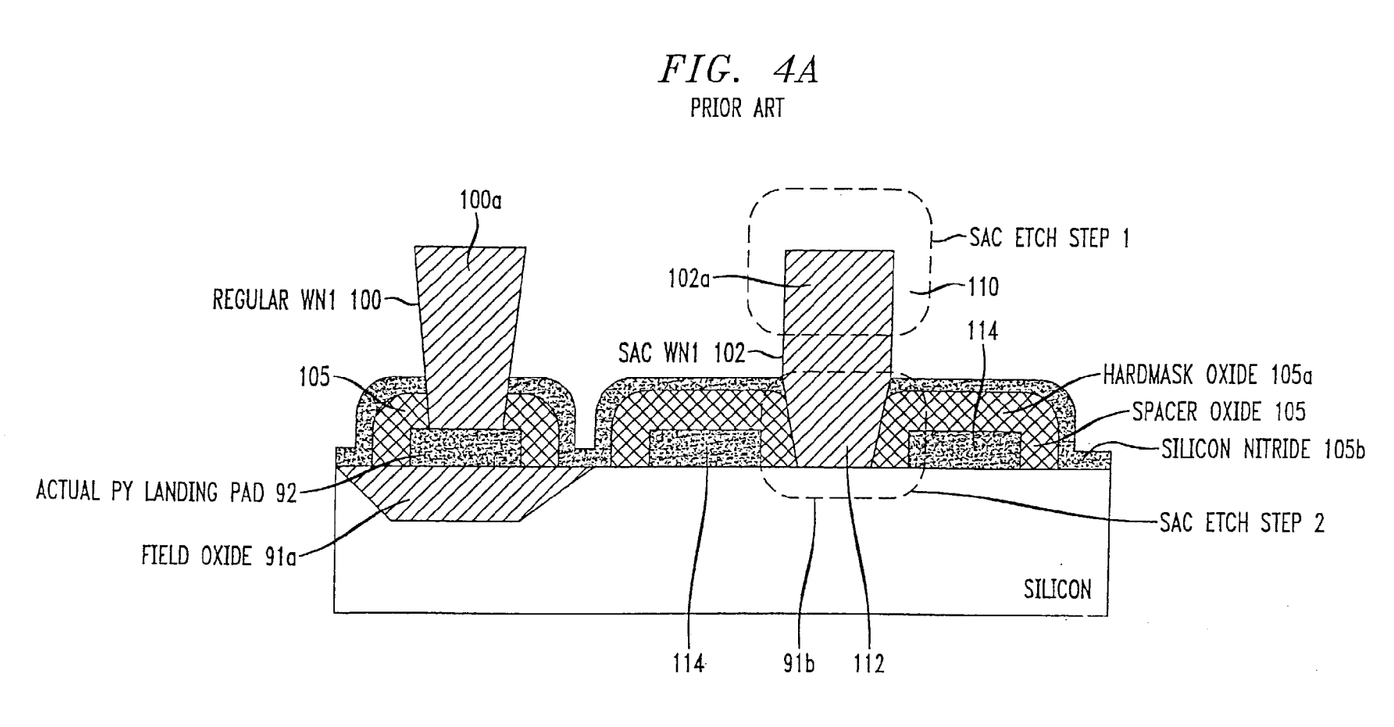
FIGS. 4A and 4B are respective schematic, cross-sectional and top plan views of a prior art self-aligned contact structure.
Figure 4B:
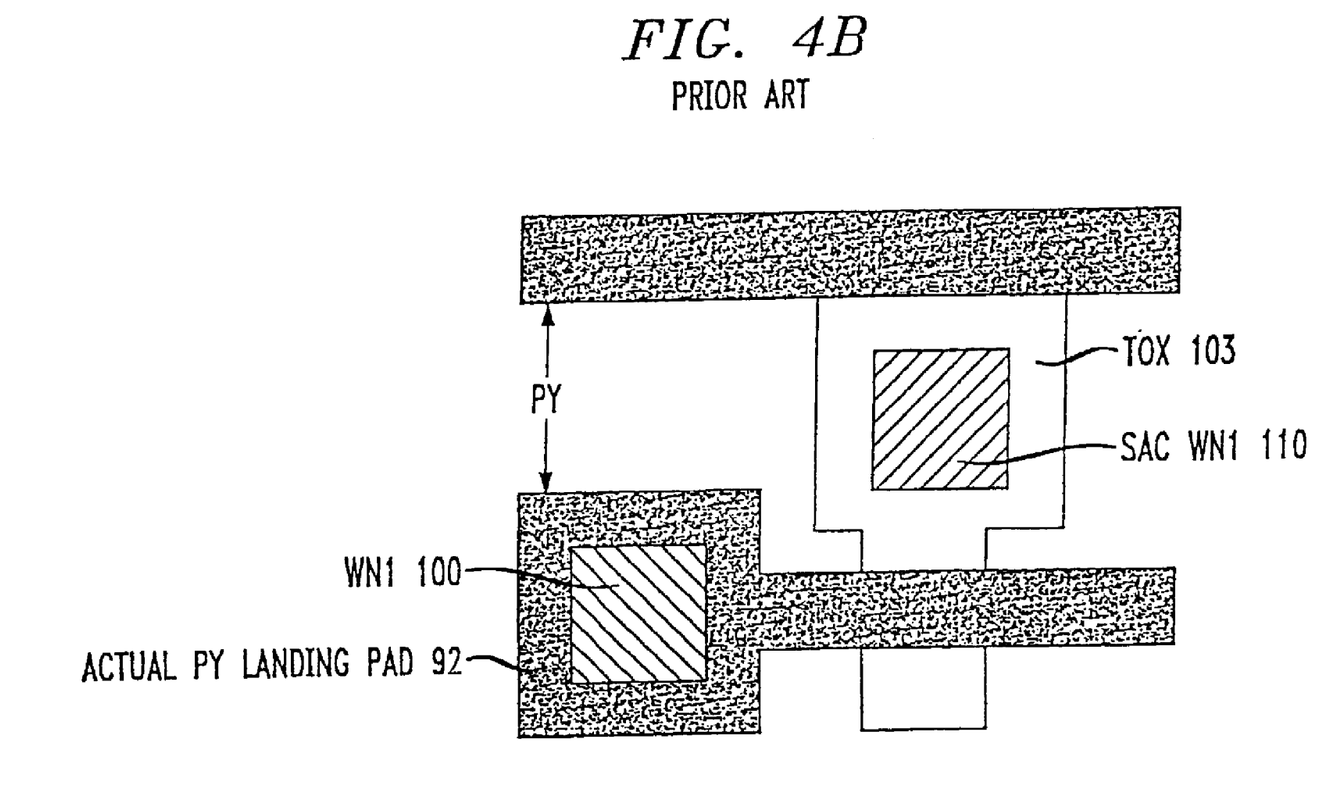

FIGS. 4 and 4A are highly schematic drawings that illustrate a prior art structure using a self-aligned contact window opening with a silicon substrate 90 having a respective field oxide region and spaced active region 91a, 91b, containing the source and drain regions (not shown), and polysilicon (PY) landing pad 92 positioned over the field oxide region 91a. A regular window opening is illustrated at 100 (WH1) and would include a contact 100a. The self-aligned contact window opening (SAC WH1) is illustrated at 102 and positioned over thin oxide layer 103 (TOX) FIG. 4B, and would include a self-aligned contact 102a. Each opening 100, 102 can contain the respective plugs that are formed by techniques known to those skilled in the art. The windows 100, 102 include the sidewall spacers 105 formed as an oxide known to those skilled in the art. A hard mask oxide 105a and silicon nitride layer 105b is formed as illustrated. The silicon nitride layer or similarly formed layer is essential for the present invention and forms a liner, as is known to those skilled in the art.

The self-aligned contact window opening 101 includes a first top portion 110 that is formed by a first self-aligned contact etch step in a technique known to those skilled in the art. The second, lower portion 112 is formed by the second self-aligned contact etch step to form the illustrated structure in a technique known to those skilled in the art. Polysilicon landing pad structure 114 is associated and over the second active region 91b. FIG. 4B illustrates a top view with the landing pad 92 and self-aligned contact window opening 102, and regular window opening 100.

Figure 5A:
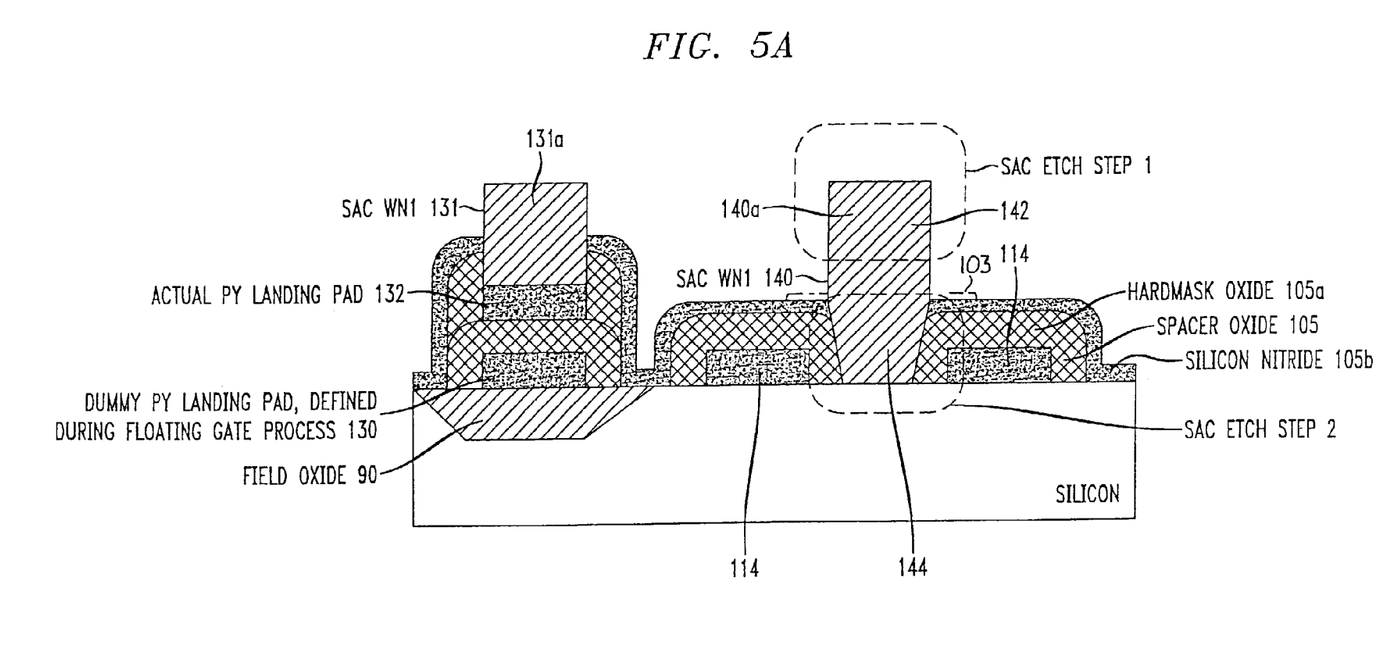
FIGS. 5A and 5B are respective cross-sectional and top plan views of a self-aligned contact structure of the present invention where a dummy landing pad is defined during a floating gate manufacturing process.
Figure 5B:
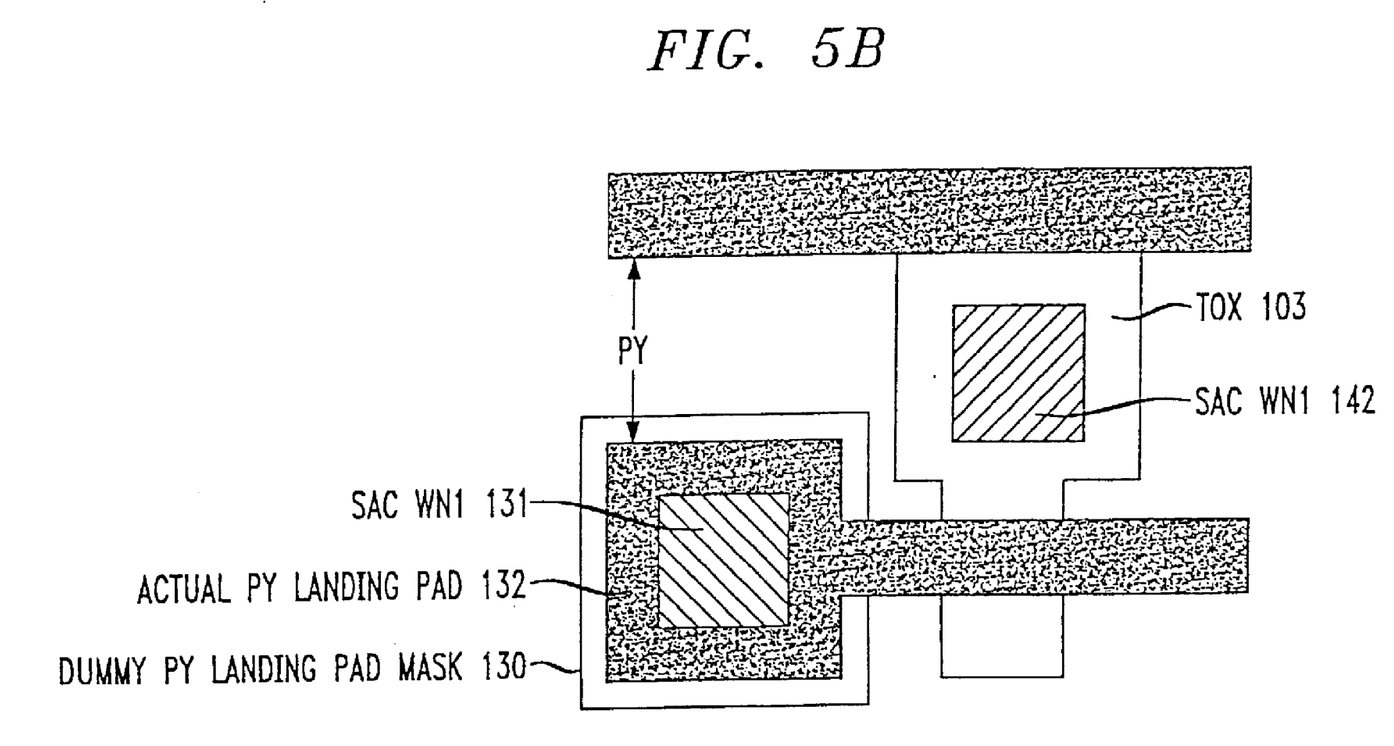

FIGS. 5A and 5B are highly schematic views that illustrate the advantages of the present invention where a dummy landing pad 130 is defined during a floating gate manufacturing process. As a result, what was the regular window opening 100 can be formed as a first self-aligned contact window opening 131 with self-aligned contact 131a. An actual polysilicon landing pad 132 is formed at this first self-aligned contact window opening and is elevated with a second self-aligned contact window 140 that corresponds to the self-aligned contact window opening shown in FIG. 4A. In the structure shown in FIGS. 4A and 4B, the self-aligned contact etch process was typically done with two etch steps where the first step did not have little etch selectivity of nitride over the oxide, but just had removal of dielectric. The second step did not have excellent etch selectivity of oxide and silicon over the silicon nitride 105b since the spacer needs had to be protected. Thus, according to the prior art of FIGS. 4A and 4B, it was not possible to define the regular window opening on top of the polysilicon and on top of the silicon, as well as the self-aligned contact window opening at the same time. However, both window openings 131, 140 can be defined at the same time in accordance with the present invention when the actual poly-landing is raised by the dummy polysilicon landing pad 130, and thus, the regular window on top of the polysilicon landing pad will be defined during the self-aligned contact etch step one. The self-aligned window opening 140 includes the upper portion 142 formed during the first part of the etch step and the lower second lower portion 144.

Figure 6:
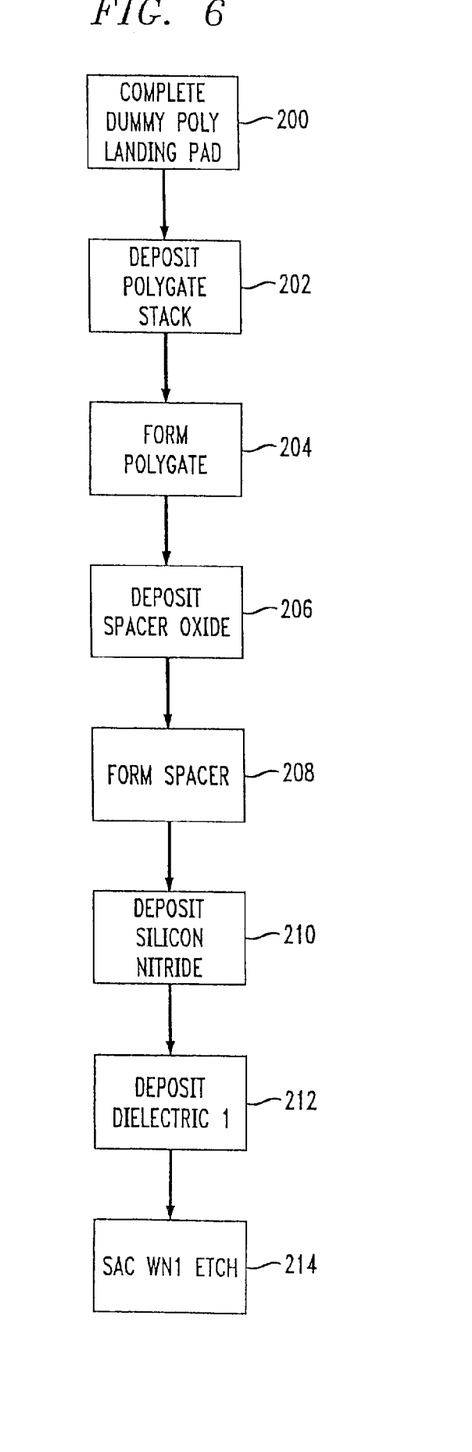
FIG. 6 is a flow chart illustrating the basic method of the present invention.

Referring now to FIG. 6, there is illustrated a flow chart showing the basic steps for forming the semiconductor integrated circuit device of the present invention. As shown in block 200, a dummy poly landing pad is first formed. A poly gate stack is then deposited such as could be a gate oxide, a polysilicon or hard mask oxide as shown at block 202. A poly gate is then formed (block 204), such as through gate photolithography and a radio frequency plasma etch. A spacer oxide is deposited (block 206), such as typically with a TEOS film. A spacer is formed (block 208), such as by a radio frequency plasma etch. The silicon nitride is deposited (block 210) with low pressure chemical vapor deposition, high density plasma or PECVD. A dielectric 1 is deposited (block 212) by high density plasma, PSG oxide, or BPSG. Finally, the first window self-aligned contact etch is conducted (block 214). The self-aligned contact window etch can consist of three steps. The first etch has little etch selectivity of the oxide over the nitride, but the second etch has great etch selectivity of oxide over the nitride because the etch can be estopped on the silicon nitride film. Now, the gas chemistry is changed to remove the silicon nitride. The etch has great etch selectivity of silicon nitride over silicon oxide. Naturally, the above-identified description does not include the implantation processes, which are necessary for transistor formation because the implant is irrelevant for the self-aligned contact process.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A semiconductor integrated circuit memory device comprising:

a silicon substrate having a field oxide region and a spaced active region formed therein;

first and second self-aligned contacts formed in respective first and second self-aligned contact window openings that are associated with the respective field oxide region and active region, wherein said second self-aligned contact comprises an upper portion and a lower portion;

a thin oxide layer positioned below the first upper portion of said second self-aligned contact;

a single dummy polysilicon landing pad formed over said field oxide region and formed below said first self-aligned contact window opening; and a single operative polysilicon landing pad formed above said single dummy landing pad at said first self-aligned contact window opening and the first self-aligned contact elevated to a position substantially level with the upper portion of the second self-aligned contact.

2. The device according to claim 1, wherein said upper portion is formed during a first self-aligned contact etch step and said lower portion is formed during a second self-aligned contact etch step.

3. The device according to claim 2, wherein said first self-aligned contact window opening is formed during the first self-aligned contact etch step.

4. The device according to claim 3, and including a spacer oxide and further comprising a silicon nitride layer that is formed before a self-aligned contact etch step and over the spacer oxide.

5. The device according to claim 1, wherein said dummy landing pad is formed during a floating gate fabrication process.

6. The device according to claim 1, and further comprising a polysilicon landing pad overlying a portion of the active region.

7. The device according to claim 1, and further comprising sidewall spacers formed on the ends of the polysilicon landing pad overlying a portion of the active region.

8. The device according to claim 1, and further comprising sidewall spacers formed on the ends of the operative polysilicon landing pad.

* * * * *